United States Patent [19]
Inoue et al.

[11] Patent Number: 5,733,802
[45] Date of Patent: Mar. 31, 1998

[54] SEMICONDUCTOR DEVICE AND METHOD OF MANUFACTURING THE SAME

[75] Inventors: Yumi Inoue; Tsutomu Nakazawa, both of Yokohama, Japan

[73] Assignee: Kabushiki Kaisha Toshiba, Kawasaki, Japan

[21] Appl. No.: 538,204

[22] Filed: Oct. 3, 1995

[30] Foreign Application Priority Data

Oct. 6, 1994 [JP] Japan .................. 6-242992

[51] Int. Cl.$^6$ .................................. H01L 21/60
[52] U.S. Cl. .................. 438/127; 438/112; 438/124; 438/126
[58] Field of Search ................. 437/209, 211, 437/213, 214, 215, 217, 218, 219, 220; 438/111, 112, 118, 119, 121, 124, 125, 126, 127

[56] References Cited

U.S. PATENT DOCUMENTS

| | | | |
|---|---|---|---|
| 4,999,319 | 3/1991 | Hamano et al. | 437/211 |
| 5,304,512 | 4/1994 | Arai et al. | 437/214 |
| 5,424,250 | 6/1995 | Sawada | 437/211 |
| 5,496,775 | 3/1996 | Brooks | 437/214 |

FOREIGN PATENT DOCUMENTS

| | | |
|---|---|---|
| 5-90314 | 4/1993 | Japan . |
| 5-175264 | 7/1993 | Japan . |

*Primary Examiner*—Kevin Picardat
*Attorney, Agent, or Firm*—Finnegan, Henderson, Farabow, Garrett & Dunner, L.L.P.

[57] ABSTRACT

There is provided a semiconductor device having a very thin, highly reliable semiconductor package and a method of easily manufacturing the semiconductor apparatus. The method comprises a first step of coating and melting a thermosetting resin in a mold for resin sealing, while keeping the mold at a predetermined temperature, the mold being divided into an upper mold and a lower mold, a second step of fixing within the mold a lead frame supporting a semiconductor chip, and a third step of applying a pressure on the mold and compression-molding the resin, thus forming a package.

32 Claims, 7 Drawing Sheets

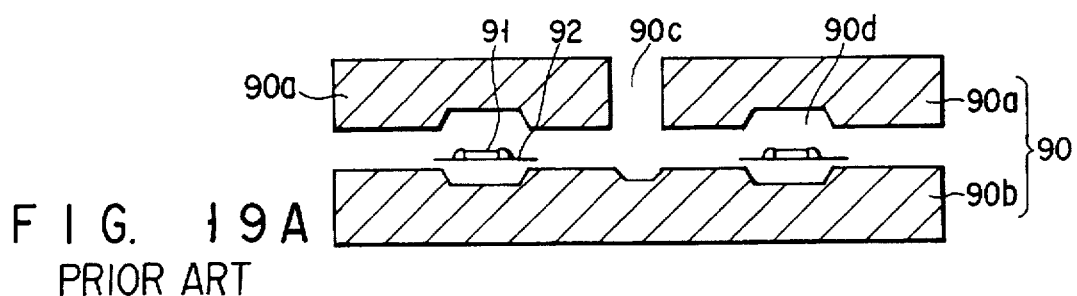
FIG. 19A PRIOR ART
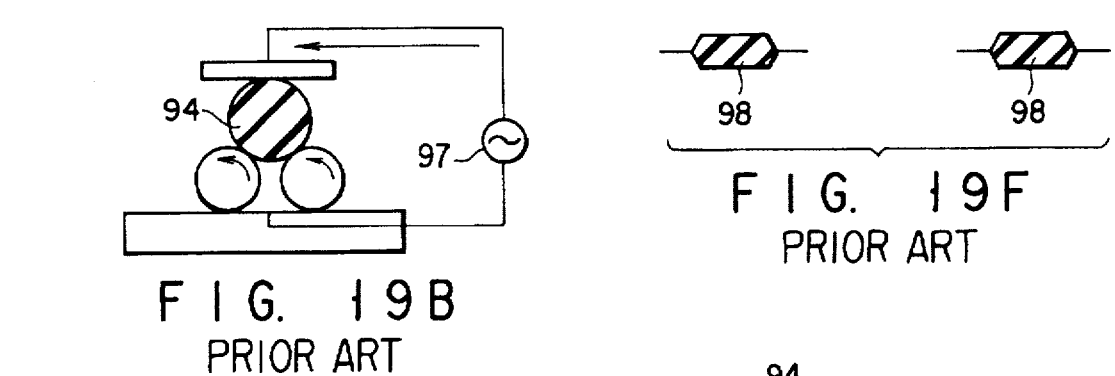
FIG. 19B PRIOR ART
FIG. 19F PRIOR ART
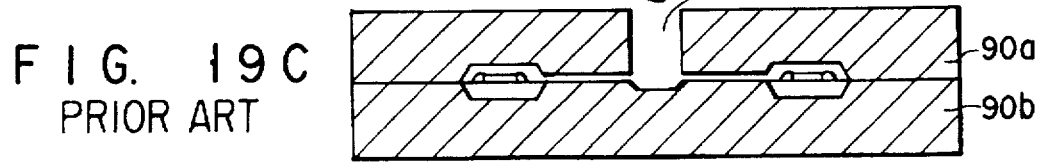
FIG. 19C PRIOR ART
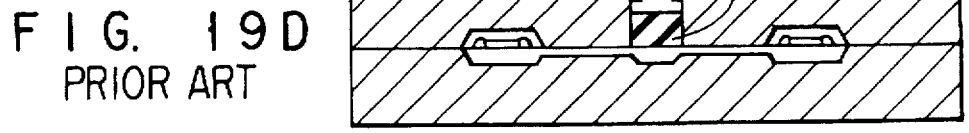
FIG. 19D PRIOR ART
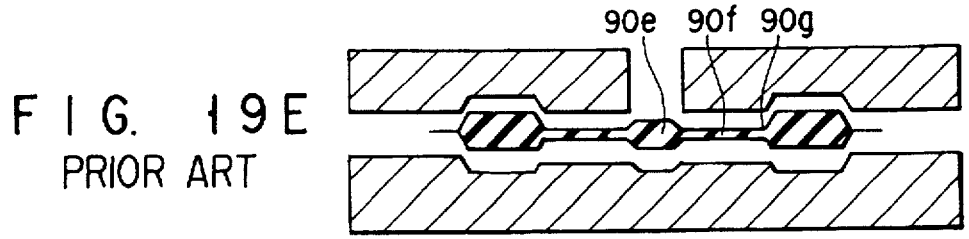
FIG. 19E PRIOR ART

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and more particularly to a semiconductor device having a resin-sealed package and a method of manufacturing the same.

2. Description of the Related Art

FIGS. 18A to 18C show examples of resin-sealed packages of conventional semiconductor devices, manufactured by using TAB (Tape Automated Bonding) techniques. Reference numeral 81 denotes a semiconductor chip, 82 a bump electrode formed on the semiconductor chip 81, 83 a TAB lead, 84 a polyimide tape for supporting the TAB lead 83, and 85 a protection resin sealing the semiconductor chip 81 and inner lead portions of the lead 83.

In the package shown in FIG. 18A, a solid resin sheet formed by glass fibers impregnated with epoxy resin is cut to a size slightly greater than the size of the chip 81, and the cut solid resin sheet is attached to each side surface of the chip 81 and thermally melted, thus forming-the protection resin 85. This structure was widely used when the TAB technique began to prevail, but now it is not widely used.

In the package shown in FIG. 18B, a solvent type liquid-phase resin is coated by a potting method on the surfaces of the chip 81 as well as the inner lead portions of the lead 83. The resin is then solidified by several heat treatment processes, thereby forming the protection resin 85. This structure is now prevalent since a relatively thin package can be obtained.

In the package shown in FIG. 18C, the chip 81 on which the inner lead portions have been bonded is sealed with resin, thereby forming the protection resin 85. This package is formed by a transfer mold method for resin-sealing a chip on a lead frame.

FIGS. 19A to 19F show examples of steps of resin-sealing a conventional semiconductor device with a lead frame by a transfer mold apparatus. Reference numeral 90 denotes a mold, 90a an upper mold, 90b a lower mold, 90c a pot portion, 90d a cavity portion, 90e a cull portion, 90f a runner portion, and 90g a gate portion. Numeral 91 denotes a semiconductor chip, 92 a lead frame, 94 a resin tablet, 96 a plunger, and 97 a high frequency heater.

As is shown in FIG. 19A, the lead frame 92 supporting the chip 91 already subjected to the bonding process is set on the heated lower mold 90b. The upper mold 90a is lowered and fixed. Then, as shown in FIG. 19B, the resin tablet 94 is preheated by the high frequency heater 97, and the preheated tablet 94 is inserted through the pot portion 90c, as shown in FIG. 19C. Subsequently, the plunger 96 is lowered, as shown in FIG. 19D, and the resin is injected into the cavity portion 90d of the mold and solidified.

FIG. 20 illustrates the flow of the resin 90a in the transfer mold apparatus in the step shown in FIG. 19D. After the resin tablet 94 is fed into the pot portion 90c, the tablet 94 is injected by the plunger 96 and put into the cavity portion 90d as resin 94a via the runner portion 90f and gate portion 90g. The lead frame 92 is set in the cavity portion 90d, as mentioned above, and the chip 91 is mounted on a die pad portion 92a of the lead frame 92. Electrodes on the chip 91 are connected to the lead frame 92 by bonding wires 93.

After the upper mold 90a is raised and the molded product is taken out, as shown in FIG. 19E, a resin-sealed package 98 is cut and completed as a single body, as shown in FIG. 19F.

However, the semiconductor package shown in FIG. 18A does not have a uniform outer shape, and thus it is difficult to reduce the thickness thereof. Although the thickness of the semiconductor package shown in FIG. 18B can be reduced, the bottom of the chip is not resin-sealed. Consequently, thermal expansion is unbalanced, and the lead may be cut or cracks may occur in the chip due to thermal stress. Moreover, since this package is not subjected to thermal pressure contact molding using a mold, etc., the outer shape thereof is not regular. Besides, the transfer mold type semiconductor package shown in FIGS. 18C and 19A to 19F can be manufactured to have a uniform outer shape. However, it is necessary to preheat the resin tablet 94 by the high frequency heater 97 prior to the molding. In addition, when the resin 94a is injected, the bonding wire 93 may be deformed, the die pad portion 92a of the lead frame 92 supporting the chip 91 may be inclined, or the resin may not be fully injected, resulting in non-sealed portions.

Furthermore, when the thickness of the package is extremely reduced, the flow of the resin 94a in the cavity portion 90d is considerably limited, resulting in incomplete filling of the resin or occurrence of a void. Even a slight inclination of the chip 91 is also a serious problem.

As an example of a thinned package, suppose a memory card in which a memory LSI chip is resin-sealed. In general, the memory card is mounted in a multiple-stacked manner or in a very narrow space. Thus, the outer shape of the package needs to be uniform. Therefore, the package must be formed not by a bonding seal method but by a mold method such as a transfer mold method, so as to have a uniform outer shape.

However, when the thin package is formed by the transfer mold method, as described above, a slight inclination of the chip during the resin injection may result in a non-sealed portion of the chip. It is difficult to stably form the thin package by the transfer mold method. In the case where the thickness of the die pad portion of the lead frame is about 150 µm, the thickness of the LSI chip is about 350 µm and the thickness of a resin layer which can be formed by the transfer mold method on the upper and lower surfaces of the LSI chip is about 100 µm, the thickness of the package stably formed by the transfer mold method exceeds about 1 mm at present.

As has been described above, the conventional semiconductor apparatus has a problem in that it is difficult to stably form a very thin package with a thickness of 1 mm or less by injection-molding a resin by the transfer mold method.

SUMMARY OF THE INVENTION

The present invention has been made in consideration of the above problem, and its object is to provide a semiconductor device having a very thin, highly reliable semiconductor package and a method of easily manufacturing the semiconductor apparatus.

According to this invention, there is provided a semiconductor device wherein a semiconductor chip is resin-sealed in a package formed by resin compression with use of a mold so as to have a thickness of 1 mm or less.

There is also provided a method of manufacturing a semiconductor device, comprising:

a first step of coating and melting a thermosetting resin in a mold for resin sealing, while keeping the mold at a predetermined temperature, said mold being divided into an upper mold and a lower mold;

a second step of fixing within said mold one of a lead frame and a TAB tape supporting a semiconductor chip; and a third step of applying a pressure on the mold and compression-molding the resin, thus forming a package.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 19A to 19F show examples of steps of resin-sealing a package of a conventional semiconductor device with use of a lead frame by means of a transfer mold apparatus.

DESCRIPTION OF THE PREFERRED EMBODIMENTS

Figure 1A:
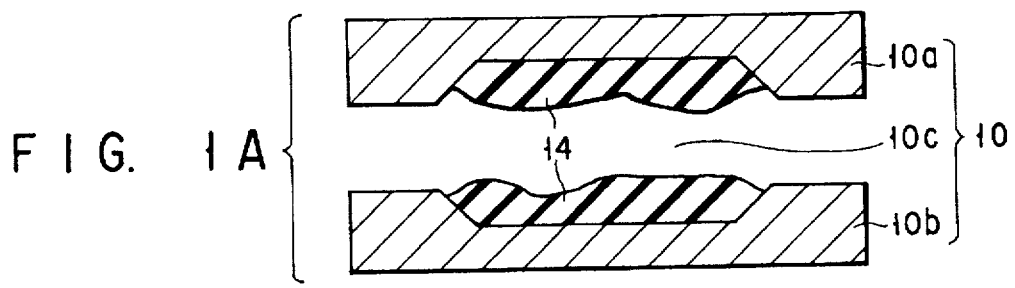
FIGS. 1A to 1D show examples of steps of forming a package of a semiconductor device with use of a lead frame, according to a first embodiment of the present invention.

Embodiments of the present invention will now be described in detail with reference to the accompanying drawings. FIGS. 1A to 1D show examples of steps of forming a package of a semiconductor device with use of a lead frame, according to a first embodiment of the present invention. Reference numeral 10 denotes a mold for resin sealing which includes an upper mold 10a, a lower mold 10b and a cavity portion 10c. Numeral 11 denotes a semiconductor chip, and 12 a lead frame. The semiconductor chip 11 is attached on a die pad portion 12a of the lead frame 12 by means of an adhesive (not shown). Numeral 13 denotes bonding wires for electrically connecting electrodes (not shown) of the semiconductor chip 11 to the lead frame 12. Numeral 14 denotes a thermosetting resin, and 15 a resin package formed by compression-molding the resin 14 so as to seal the chip 11, bonding wires 13 and inner lead portions of the lead frame 12.

When the package is formed, the semiconductor chip 11 is attached and mounted on the die pad portion 12a in advance, and the electrodes of the chip 11 are connected to the lead frame 12 by the bonding wires 13. On the other hand, as shown in FIG. 1A, the mold 10 comprising the upper mold 10a and lower mold 10b is kept at a predetermined temperature (e.g. about 100° C. to 170° C.). The thermosetting resin 14 is coated on the inside surfaces of the mold 10 and melted. In this example, a powder resin is sprayed on the inside surfaces of the mold (i.e. on the walls defining the cavity portion 10c). In this case, the molten resin 14 on the upper mold 10a remains in the upper mold 10a by virtue of the viscosity and surface tension of the resin 14. However, when a thick package is formed, the amount of resin sprayed on the upper mold 10a increases and the resin in the upper mold 10a may drop. In order to prevent the dropping of the resin, the physical properties and mold temperature must be optimally determined when the amount of resin is large.

Figure 1B:
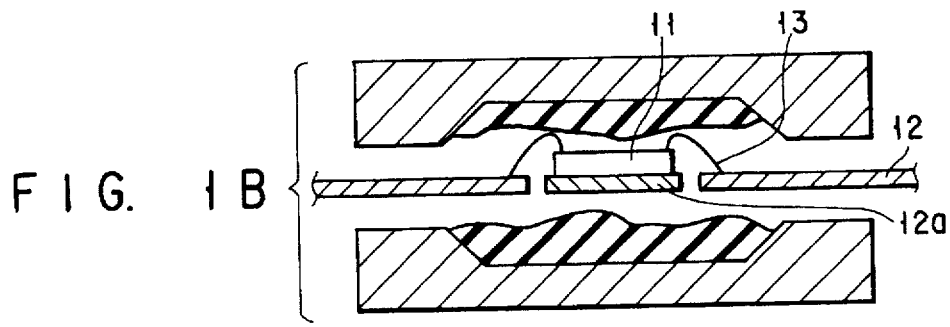
Figure 1C:
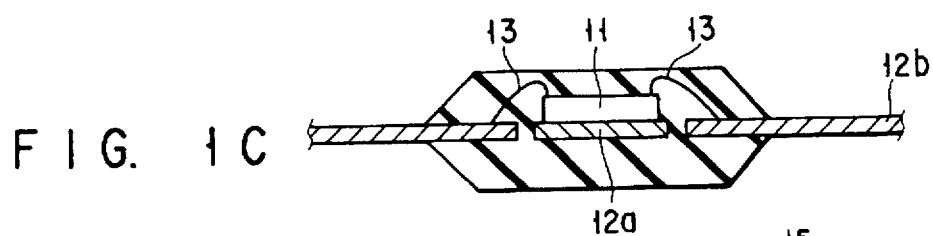
Figure 1D:
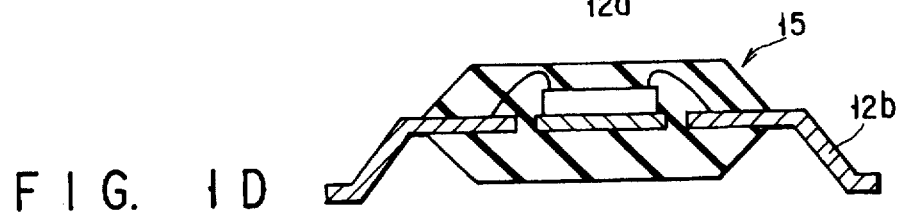

As is shown in FIG. 1B, the lead frame supporting the chip is fixed in the mold 10 (i.e. between the upper mold 10a and lower mold 10b in this example). A vertical pressure is applied to the mold 10 and the molten resin 14 is compression-molded. After the resin is solidified to some extent, the upper and lower molds 10a and 10b are separated and the lead frame 12 is taken out of the mold 10, as shown in FIG. 1C. Subsequently, as shown in FIG. 1D, outer lead portions 12b of the lead frame 12, which are located outside the resin structure, are processed to have a shape suitable for mounting on a circuit board (not shown) (in this example, a gull-wing shape). Thus, the resin-sealed package 15 is formed.

According to the manufacturing steps of the first embodiment, the outer shape of the package can be made uniform, like a package formed by a conventional transfer mold method.

In addition, unlike the transfer mold method, the flow of the resin is not required. Thus, it is possible to prevent floating, inclination or exposure of the chip in the resin-sealed package. A thin resin-sealed package can be advantageously realized. For example, in the case where a thin resin-sealed package is formed by a conventional molding method such as a transfer mold method which requires the flow of resin, if the amount of supplied resin is small, the resin is not filled in the entire inner space of the mold. As a result, a thin package is not obtained. According to the present embodiment, however, the amount of resin supplied into the mold can be reduced and the thin package can be easily formed. Furthermore, in the transfer mold method, a resin must be wasted in the cull portion, runner portion, etc. in order to flow the resin. In the present embodiment, no resin is wasted and the amount of necessary resin can be remarkably reduced.

According to the manufacturing steps of this embodiment, the resin need not be preheated at the time of resin-sealing. Since the mold is kept at high temperatures (e.g. 100° C. to 170° C.) and the powder resin (i.e. a resin in the easily meltable state) is coated on the mold, the resin can be easily melted and the manufacturing time can be remarkably reduced.

Figure 2A:
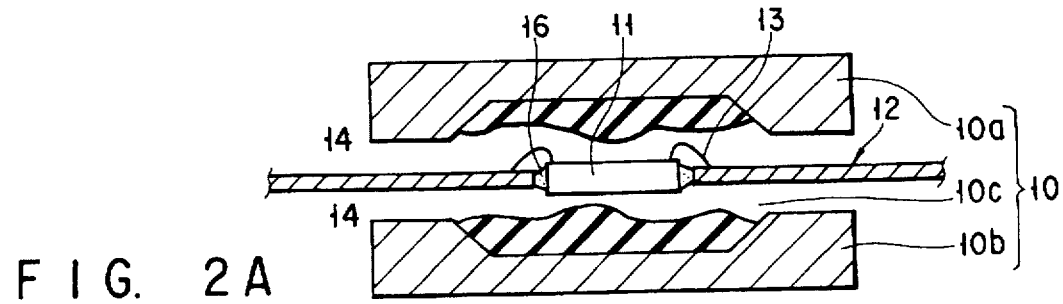
FIGS. 2A and 2B show examples of steps of forming a package of a semiconductor device with use of a lead frame, according to a second embodiment of the present invention.
Figure 2B:
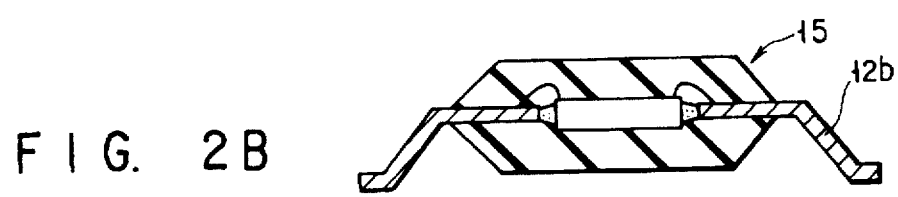

FIGS. 2A and 2B show examples of steps of forming a package of a semiconductor device with use of a lead frame, according to a second embodiment of the present invention. A mold 10 for resin sealing includes an upper mold 10a, a lower mold 10b and a cavity portion 10c. Numeral 11 denotes a semiconductor chip, and 12 a lead frame. The lead frame 12 does not have a die pad portion but has a chip mount hole. Numeral 13 denotes bonding wires for electrically connecting electrodes of the semiconductor chip 11 to the lead frame 12. The semiconductor chip 11 is not fixed at its upper surface or its lower surface. The chip 11 is mounted in the chip mount hole in the lead frame 12. The chip 11 is fixed to the lead frame 12 on its sides by means of an adhesive 16. Numeral 14 denotes a thermosetting resin, and 15 a resin package formed by compression-molding the resin 14 so as to seal the chip 11, bonding wires 13 and inner lead portions of the lead frame 12.

When the package is formed, the side faces of the lead frame 12 are bonded to the side surfaces of the chip 11 by the adhesive 16 in advance and the electrodes of the chip 11 are connected to the lead frame 12 by the bonding wires 13. The mold 10 is kept at a predetermined temperature (e.g. 100° C. to 170° C.). The thermosetting resin 14 is coated on the inside surfaces of the upper and lower molds 10a and 10b and melted.

In this state, the lead frame 12 supporting the chip, as mentioned above, is fixed between the upper mold 10a and lower mold 10b. A pressure is applied to the mold 10 and the resin 14 is compression-molded. After the resin 14 is solidified to some extent, the lead frame 12 is taken out of the mold 10. Subsequently, as shown in FIG. 2B, outer lead portions 12b of the lead frame 12, which are located outside the resin structure, are processed to have a shape suitable for mounting on a circuit board. Thus, a resin-sealed package 15, which is thinner than the package of the first embodiment at least by a degree corresponding to the thickness of the die pad portion (12a in FIG. 1) of the lead frame, is formed.

Figure 3A:
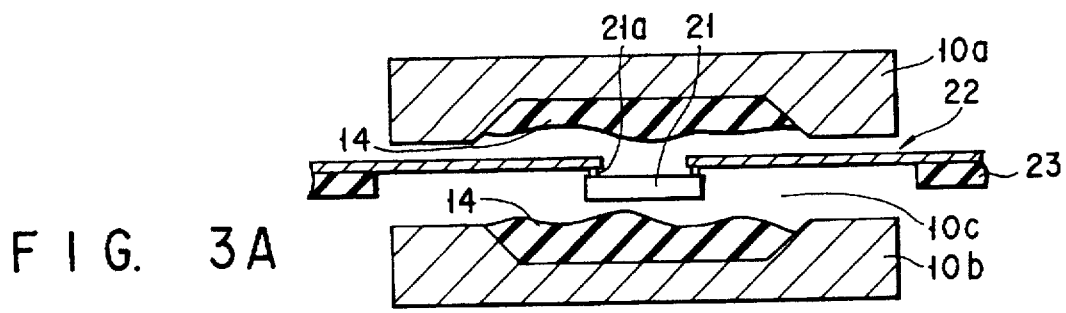
FIGS. 3A and 3B show examples of steps of forming a package of a semiconductor device with use of a TAB method, according to a third embodiment of the present invention.
Figure 3B:
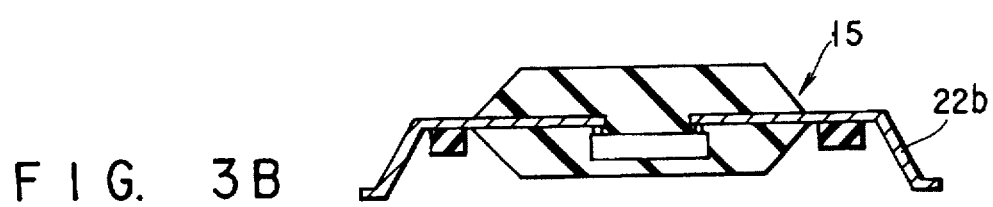

FIGS. 3A and 3B show examples of steps of forming a package of a semiconductor device with use of a TAB method, according to a third embodiment of the present invention. A mold for resin sealing includes an upper mold 10a, a lower mold 10b and a cavity portion 10c. Numeral 21 denotes a semiconductor chip on which bump electrodes 21a are formed. Numeral 22 denotes a TAB lead supported on a polyimide tape 23. The bump electrodes 21a of the semiconductor chip 21 are bonded and fixed to the TAB lead 22. Numeral 14 denotes a thermosetting resin, and 15 a resin package formed by compression-molding the resin 14 so as to seal the chip 21 and inner lead portions of the TAB lead 22.

When the package is formed, the TAB lead 22 is bonded to the bump electrodes 21a of the chip 21. The mold is kept at a predetermined temperature (100° C. or above in this embodiment). The thermosetting resin 14 is coated on the inside surfaces of the upper and lower molds 10a and 10b and melted.

In this state, the TAB tape 23 supporting the chip, as mentioned above, is fixed between the upper and lower molds. A pressure is applied to the mold and the resin 14 is compression-molded. After the resin 14 is solidified to some extent, the TAB lead 22 is taken out of the mold. Subsequently, as shown in FIG. 3B, outer lead portions 22b of the TAB lead 22, which are located outside the resin structure, are processed to have a shape suitable for mounting on a circuit board. Thus, a resin-sealed package 15 is formed.

The method of fixing the side surfaces of the chip by using a lead frame having no die pad portion is not limited to the method of the second embodiment in which the adhesive is used. A method of fixing by making use of elastic deformation (spring effect) of a lead frame or a method of plastically deforming a lead frame may be adopted.

Figure 4:
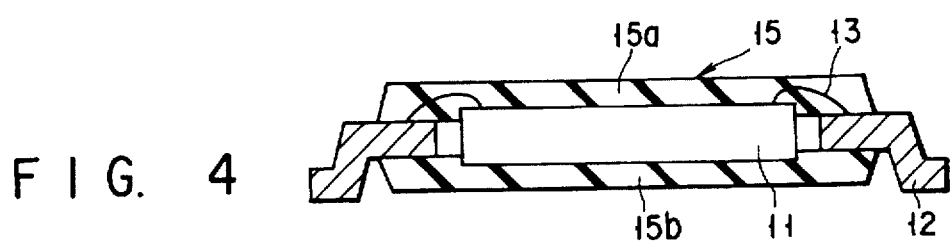
FIG. 4 is a cross-sectional view showing a package of a semiconductor device with use of a lead frame, according to a fourth embodiment of the present invention.

FIG. 4 shows a cross-sectional structure of a semiconductor device with use of a lead frame, according to a fourth embodiment of the present invention. Numeral 11 denotes a semiconductor chip, and 12 a lead frame. The lead frame 12 does not have a die pad portion but has a chip mount hole. Numeral 13 denotes bonding wires for electrically connecting electrodes of the semiconductor chip 11 to the lead frame 12. The semiconductor chip 11 is not fixed at its upper surface or its lower surface. The chip 11 is mounted in the chip mount hole in the lead frame 12. The chip 11 is fixed to support pins of the lead frame 12 on its sides by means of an adhesive. Numeral 15 denotes a resin package formed by compression-molding a resin 14 so as to seal the chip 11, bonding wires 13 and inner lead portions of the lead frame 12.

Since the die pad portion of the lead frame (12a in FIG. 1) is not provided, a resin-sealed package, which is thinner than the package of the first embodiment at least by a degree corresponding to the thickness of the die pad portion of the lead frame, is formed.

The resin-sealed package of the fourth embodiment is manufactured by manufacturing steps similar to those in the second embodiment. However, in order to prevent a warp of the package due to contraction after the molding of thermosetting resin, the thickness of a resin layer 15a formed on the upper surface of the chip is made substantially equal to that of a resin layer 15b formed on the lower surface of the chip. Thus, in the manufacturing steps, the amount of resin coated on the high-temperature upper mold is set to be the same as that of resin coated on the high-temperature lower mold.

Figure 5:
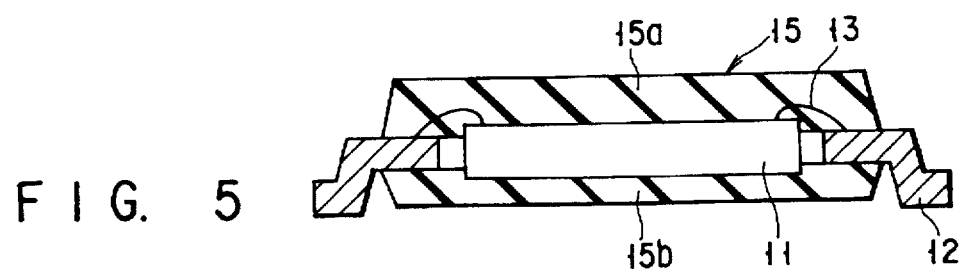
FIG. 5 is a cross-sectional view showing a package of a semiconductor device with use of a lead frame, according to a fifth embodiment of the present invention.

FIG. 5 shows a cross-sectional structure of a semiconductor device with use of a lead frame, according to a fifth embodiment of the present invention. In this semiconductor device, as compared to the semiconductor device of the fourth embodiment, the resin layer 15a formed on the upper surface of the chip 11 is made thicker than the resin layer 15b formed on the lower surface of the chip 11 in order to enhance the moisture resistance properties of the package. Thus, in the manufacturing steps, the amount of resin coated on the high-temperature upper mold is set to be greater than that of resin coated on the high-temperature lower mold.

Figure 6:
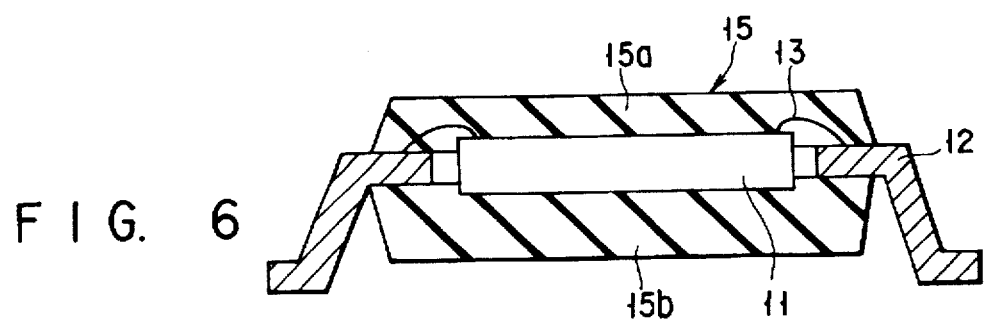
FIG. 6 is a cross-sectional view showing a package of a semiconductor device with use of a lead frame, according to a sixth embodiment of the present invention.

FIG. 6 shows a cross-sectional structure of a semiconductor device with use of a lead frame, according to a sixth embodiment of the present invention. In this semiconductor device, as compared to the semiconductor device of the fourth embodiment, the resin layer 15b formed on the lower surface of the chip 11 is made thicker than the resin layer 15a formed on the upper surface of the chip 11 in order to enhance the anti-package-crack properties of the package when the package is mounted on a circuit board. Thus, in the manufacturing steps, the amount of resin coated on the high-temperature lower mold is set to be greater than that of resin coated on the high-temperature upper mold.

When the present invention is applied to the semiconductor devices using the lead frames without die pad portion, as in the manufacturing steps of the second, fourth, fifth and sixth embodiments, very thin resin-sealed packages can be formed. In this case, the amount of resin on the upper and lower surfaces of the chip can be easily controlled. Thereby, various characteristics can be improved. For example, if the amount of resin supplied to the upper mold is set to be the same as that of resin supplied to the lower mold so that the resin layers formed on the upper and lower surfaces of the chip may have substantially equal thickness, the thermal expansion can be well balanced and the package is hardly warped. In order to enhance the moisture resistance properties of the chip, the amount of the resin supplied on the upper mold may be increased and the thickness of the resin layer on the upper surface of the chip may be increased. In order to enhance the anti-package-crack properties of the package when the package is mounted on a circuit board (a package crack occurs when moisture absorbed in the resin evaporates and expands at an interface of different materials within the package, resulting in destruction of the package), the amount of the resin supplied on the lower mold may be increased and the thickness of the resin layer on the lower surface of the chip may be increased.

Figure 7:
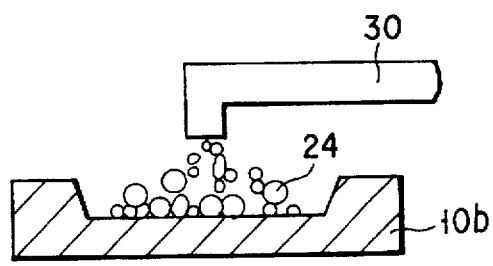
FIG. 7 shows the state in which a powder resin is sprayed on the mold from a nozzle used in an example of a step of coating a resin on the mold in the method of manufacturing the semiconductor device according to the present invention.

FIG. 7 shows an example of a step of coating a resin on the mold in the method of manufacturing the semiconductor device according to the present invention. In this step, a powder resin 24 formed by powdering a transfer mold resin tablet is sprayed from a nozzle 30 (e.g. one-point nozzle having one open distal end) onto the mold (the lower mold 10b alone is representatively shown). If a resin tablet used in the conventional transfer mold method is powdered and coated, a resin-sealed package having the same properties (resin physical properties) as the conventional resin-sealed package can be formed.

Figure 8:
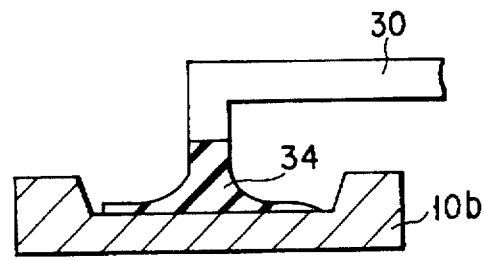
FIG. 8 shows the state in which a liquid resin is sprayed on the mold from a nozzle used in another example of a step of coating a resin on the mold in the method of manufacturing the semiconductor device according to the present invention.

FIG. 8 shows another example of a step of coating a resin on the mold in the method of manufacturing the semiconductor device according to the present invention. In this step, a liquid resin 34 is sprayed from a nozzle 30 onto the mold (the lower mold 10b alone is representatively shown). The liquid resin 34 is advantageous in that it is easily melted. In this case, the liquid resin is jetted onto the upper mold (not shown) under pressure or coated by a brush.

Figure 9:
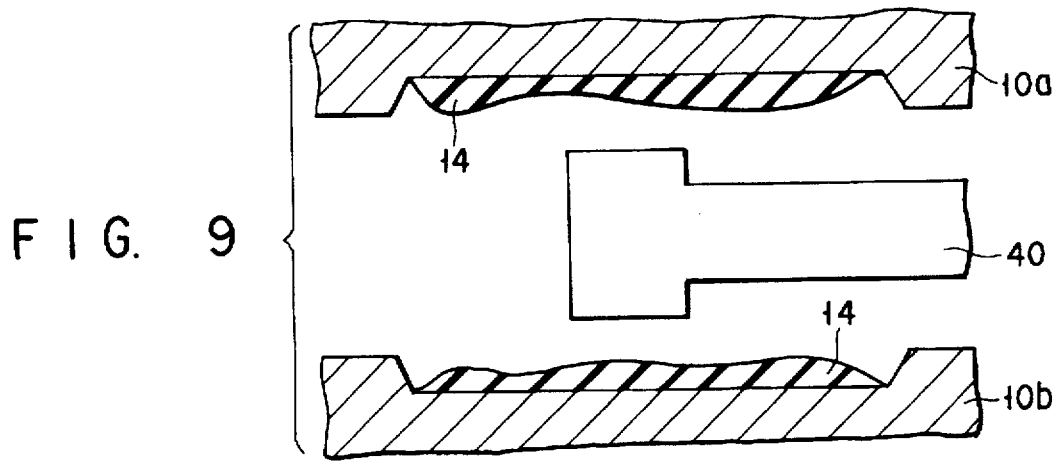
FIG. 9 is a side view showing an example of the shape of a nozzle used in another example of a step of coating a resin on the mold in the method of manufacturing the semiconductor device according to the present invention.

FIG. 9 shows an example of the shape of a nozzle used in another example of a step of coating a resin on the mold in the method of manufacturing the semiconductor device according to the present invention. In this example, a resin 14 is simultaneously coated on the upper and lower molds 10a and 10b from a single nozzle 40. Thus, the number of coating devices may be one. A distal end portion of the nozzle 40 is branched into upward and downward distal end portions. The amount of resin supplied to the upper and lower molds can be controlled by varying the shape and size of each distal end portion.

Figure 10:
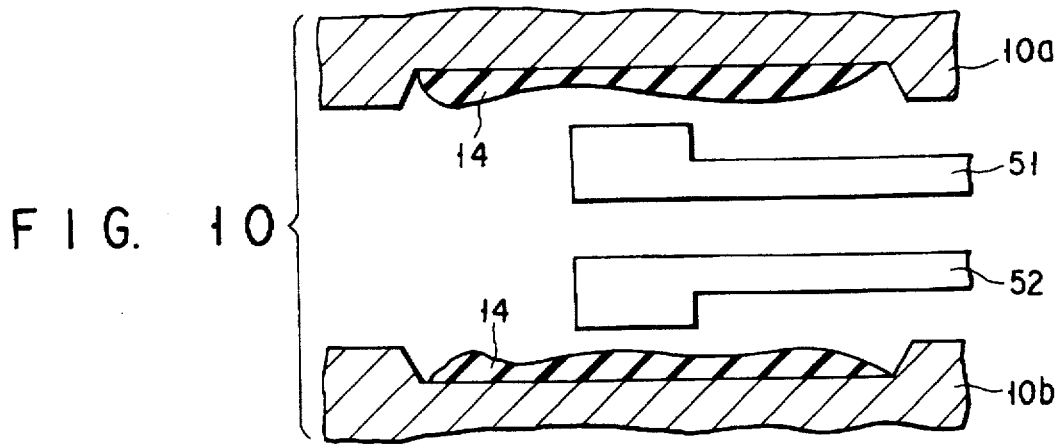
FIG. 10 is a side view showing another example of the shape of a nozzle used in another example of a step of coating a resin on the mold in the method of manufacturing the semiconductor device according to the present invention.

FIG. 10 is a side view showing another example of the shape of a nozzle used in a step of coating a resin on the mold in the method of manufacturing the semiconductor device according to the present invention. In this coating step, two nozzles 51 and 52 are used. A resin 14 is coated onto the upper and lower molds 10a and 10b from the two nozzles 51 and 52, respectively. Thus, the resin 14 is coated onto the upper and lower molds under different conditions. For example, the amount and type of resin supplied to the upper and lower molds (e.g. a powder resin onto the upper mold 10a and a liquid resin onto the lower mold 10b) can be chosen.

Figure 11:
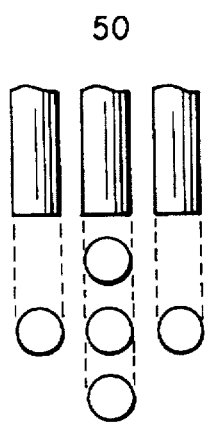
FIG. 11 is a side view showing an example of the shape of a distal end portion of a nozzle used in a step of coating a resin on the mold in the method of manufacturing the semiconductor device according to the present invention.

FIG. 11 is a side view showing still another example of the shape of a nozzle used in a step of coating a resin on the mold in the method of manufacturing the semiconductor device according to the present invention. In this coating step, a resin is coated from a multi-point nozzle 50 (having a plurality of opening distal end portions) onto the upper and lower molds. In this embodiment, the nozzle has five opening distal end portions. Thereby, the resin can be uniformly coated in a broad range within the mold. FIG. 11 shows only opening distal end portions, and does not show the nozzle body. In this side view, three distal end portions arranged in a direction perpendicular to the face of FIG. 11 overlap one another and are viewed as one distal end portion. This nozzle, however, has five distal end portions, as shown in a plan view. The number of opening distal end portions is not limited to five.

Figure 12A:
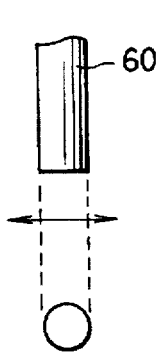
FIGS. 12A and 12B are side views showing examples of driving manners of nozzles used in a step of coating a resin on the mold in the method of manufacturing the semiconductor device according to the present invention.
Figure 12B:
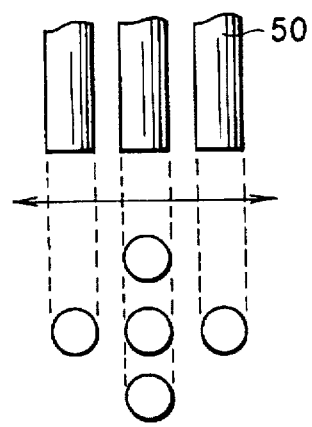

FIGS. 12A and 12B show other examples of a nozzle used in a step of coating a resin on the mold in the method of manufacturing the semiconductor device according to the present invention. In the coating step shown in FIG. 12A, a one-point nozzle 60 is reciprocally moved in the direction of a double-headed arrow to coat the resin 14 on the upper and lower molds. In the coating step shown in FIG. 12B, a multi-point nozzle 70 is reciprocally moved in the direction of a double-headed arrow to coat the resin 14 on the upper and lower molds. Thereby, the resin can be uniformly supplied in a broad range within the mold.

FIGS. 13 to 16 show other examples of the nozzle used in a step of coating a resin on the mold in the method of manufacturing the semiconductor device according to the present invention. In the coating steps shown in FIGS. 13 and 14, the resin 14 is coated from a nozzle 71 with a broadened opening end portion or a nozzle 72 with a narrowed opening end portion onto the upper and lower molds. Thus, the coating of the resin on the molds can be controlled.

Figure 13:
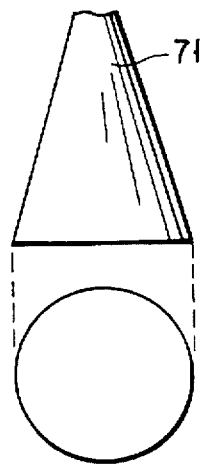
FIG. 13 is a side view showing still another example of the shape of a nozzle used in a step of coating a resin on the mold in the method of manufacturing the semiconductor device according to the present invention.
Figure 14:
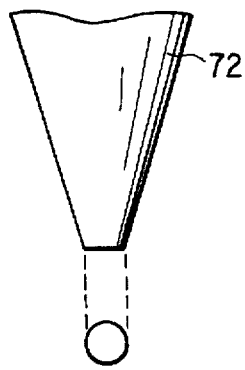
FIG. 14 is a side view showing still another example of the shape of a nozzle used in a step of coating a resin on the mold in the method of manufacturing the semiconductor device according to the present invention.
Figure 15:
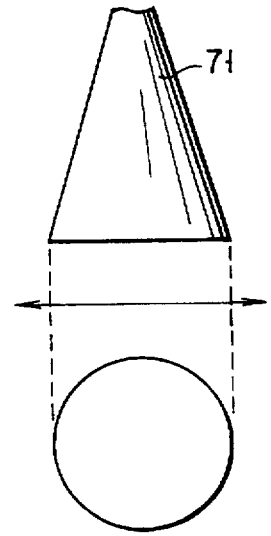
FIG. 15 is a side view showing an example of a driving manner of the nozzle shown in FIG. 13.
Figure 16:
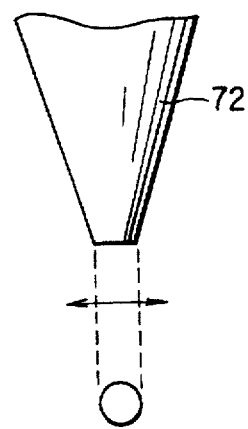
FIG. 16 is a side view showing an example of a driving manner of the nozzle shown in FIG. 14.

In the coating steps shown in FIGS. 15 and 16, the nozzle 71 with the broadened opening end portion shown in FIG. 13 and the nozzle 72 with the narrowed opening end portion are reciprocally moved in the direction of a double-headed arrow, thereby coating the resin 14 onto the upper and lower molds. Thereby, the resin can be uniformly coated on the inside of the mold.

In the steps shown in FIGS. 7 to 16, the resin is supplied from the respective nozzles onto the upper and lower molds. Thus, the type of resin supplied onto the upper and lower molds, the thickness of the resin layer to be formed and the viscosity of the resin are individually chosen and various packages can be easily manufactured. For example, a resin with a high moisture resistance property may be supplied on the upper surface of the chip and a resin with a low moisture resistance property may be supplied on the lower surface of the chip in order to prevent a crack in the package. The resin coating efficiency is enhanced by coating the resin with the multi-point nozzle or by supplying the resin while moving the nozzle.

Figure 17A:
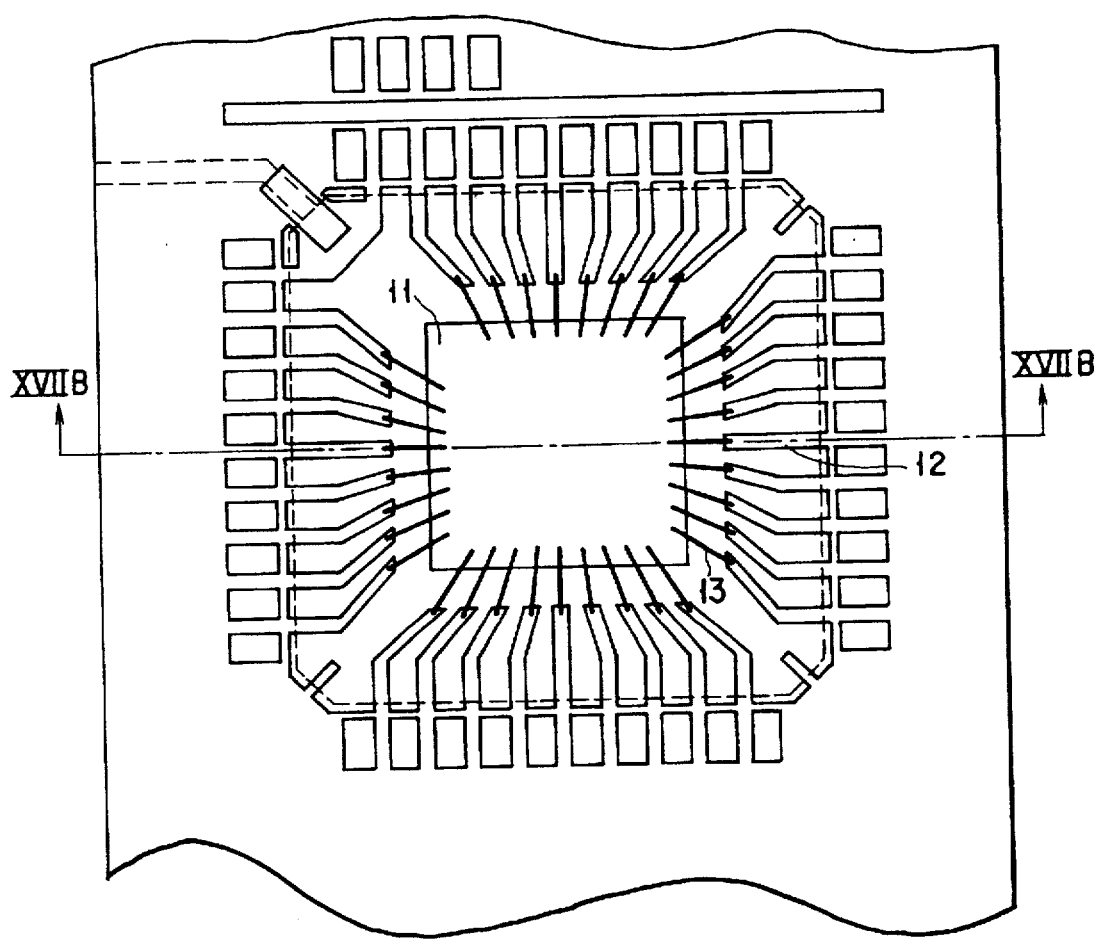
FIGS. 17A and 17B are a plan view and a cross-sectional view showing a semiconductor device with use of a lead frame, according to a seventh embodiment of the present invention.
Figure 17B:
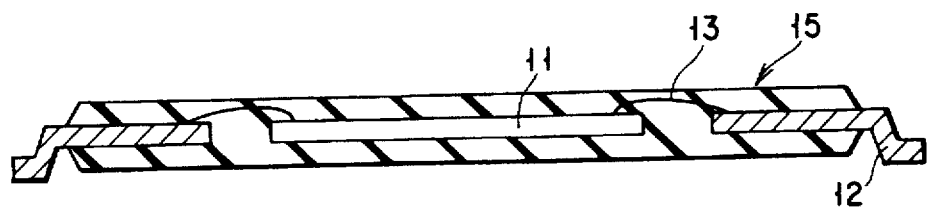
Figure 18A:
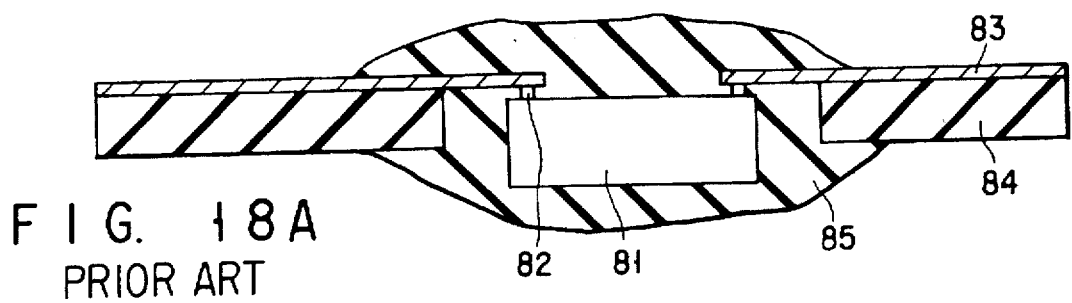
FIGS. 18A to 18C show examples of resin-sealed packages of conventional semiconductor devices with use of TAB techniques.
Figure 18B:
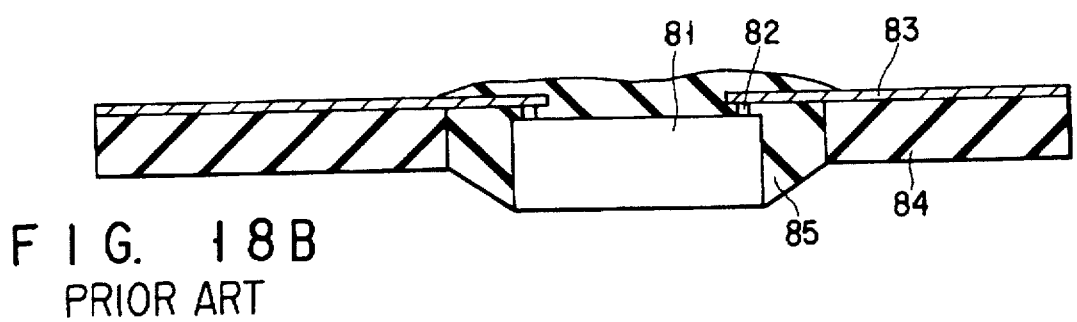
Figure 18C:
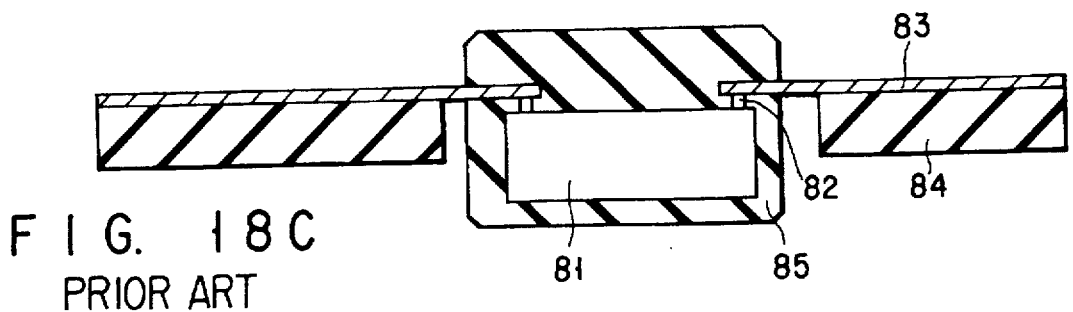
Figure 20:
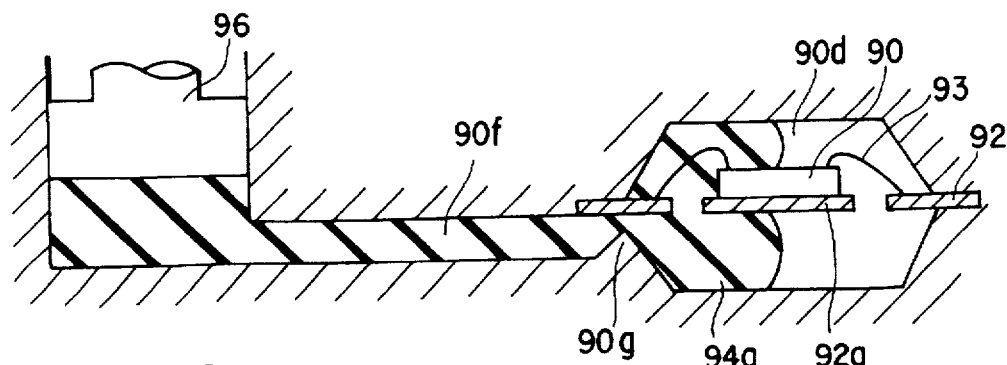
FIG. 20 shows the flow of the resin in the transfer mold apparatus in the steps shown in FIGS. 19A to 19F.

FIGS. 17A and 17B are a plan view and a cross-sectional view showing a semiconductor device with use of a lead frame, according to a seventh embodiment of the present invention. In this semiconductor device, the semiconductor chip 11 is fixed on the lead frame by bonding wires 13.

As has been described above, according to the present invention, there is provided a semiconductor device having a very thin, highly reliable semiconductor package and a method of easily manufacturing the semiconductor apparatus.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising:
   a first step of coating and melting a thermosetting resin in an inside surface of an upper mold and a lower mold for resin sealing, while keeping the mold at a [predetermined]temperature;
   a second step of fixing within said upper and lower molds one of a lead frame and a TAB tape supporting a semiconductor chip; and
   a third step of applying a pressure on the upper and lower molds and compression-molding the resin, thus forming a package.

2. The method of manufacturing the semiconductor device according to claim 1, wherein a powder resin is sprayed to coat the resin on the inside of the upper and lower molds in said first step.

3. The method of manufacturing the semiconductor device according to claim 2, wherein when said powder resin is sprayed, said powder resin is simultaneously supplied onto the insides of said upper and lower molds from a single nozzle having upwardly and downwardly branched distal end portions.

4. The method of manufacturing the semiconductor device according to claim 2, wherein when said powder resin is sprayed, said powder resin is supplied separately onto the insides of said upper and lower molds from two nozzles.

5. The method of manufacturing the semiconductor device according to claim 2, wherein when said powder resin is sprayed, said powder resin is supplied onto the inside of the mold from a nozzle having a plurality of opening distal end portions.

6. The method of manufacturing the semiconductor device according to claim 3, wherein when said powder resin is sprayed, said powder resin is supplied onto the inside of the mold while the nozzle is being moved.

7. The method of manufacturing the semiconductor device according to claim 4, wherein when said powder resin is sprayed, said powder resin is supplied onto the inside of the mold while the nozzle is being moved.

8. The method of manufacturing the semiconductor device according to claim 5, wherein when said powder resin is sprayed, said powder resin is supplied onto the inside of the mold while the nozzle is being moved.

9. The method of manufacturing the semiconductor device according to claim 2, wherein when said powder resin is sprayed, an equal amount of resin is supplied onto the insides of the upper and lower molds.

10. The method of manufacturing the semiconductor device according to claim 3, wherein when said powder resin is sprayed, an equal amount of resin is supplied onto the insides of the upper and lower molds.

11. The method of manufacturing the semiconductor device according to claim 4, wherein when said powder resin is sprayed, an equal amount of resin is supplied onto the insides of the upper and lower molds.

12. The method of manufacturing the semiconductor device according to claim 5, wherein when said powder resin is sprayed, an equal amount of resin is supplied onto the insides of the upper and lower molds.

13. The method of manufacturing the semiconductor device according to claim 6, wherein when said powder resin is sprayed, an equal amount of resin is supplied onto the insides of the upper and lower molds.

14. The method of manufacturing the semiconductor device according to claim 7, wherein when said powder resin is sprayed, an equal amount of resin is supplied onto the insides of the upper and lower molds.

15. The method of manufacturing the semiconductor device according to claim 8, wherein when said powder resin is sprayed, an equal amount of resin is supplied onto the insides of the upper and lower molds.

16. The method of manufacturing the semiconductor device according to claim 2, wherein when said powder resin is sprayed, different amounts of resin are supplied onto the insides of the upper and lower molds.

17. The method of manufacturing the semiconductor device according to claim 3, wherein when said powder resin is sprayed, different amounts of resin are supplied onto the insides of the upper and lower molds.

18. The method of manufacturing the semiconductor device according to claim 4, wherein when said powder resin is sprayed, different amounts of resin are supplied onto the insides of the upper and lower molds.

19. The method of manufacturing the semiconductor device according to claim 5, wherein when said powder resin is sprayed, different amounts of resin are supplied onto the insides of the upper and lower molds.

20. The method of manufacturing the semiconductor device according to claim 6, wherein when said powder resin is sprayed, different amounts of resin are supplied onto the insides of the upper and lower molds.

21. The method of manufacturing the semiconductor device according to claim 7, wherein when said powder resin is sprayed, different amounts of resin are supplied onto the insides of the upper and lower molds.

22. The method of manufacturing the semiconductor device according to claim 8, wherein when said powder resin is sprayed, different amounts of resin are supplied onto the insides of the upper and lower molds.

23. The method of manufacturing the semiconductor device according to claim 1, wherein in order to coat the resin onto the inside of the mold in said first step, a resin formed by powdering a resin table for transfer molding is sprayed.

24. The method of manufacturing the semiconductor device according to claim 1, wherein a liquid resin is coated onto the inside of the mold in said first step.

25. The method of manufacturing the semiconductor device according to claim 2, wherein when said powder resin is sprayed, different kinds of resins are supplied onto the insides of the upper and lower molds.

26. The method of manufacturing the semiconductor device according to claim 3, wherein when said powder resin is sprayed, different kinds of resins are supplied onto the insides of the upper and lower molds.

27. The method of manufacturing the semiconductor device according to claim 4, wherein when said powder resin is sprayed, different kinds of resins are supplied onto the insides of the upper and lower molds.

28. The method of manufacturing the semiconductor device according to claim 5, wherein when said powder resin is sprayed, different kinds of resins are supplied onto the insides of the upper and lower molds.

29. The method of manufacturing the semiconductor device according to claim 6, wherein when said powder resin is sprayed, different kinds of resins are supplied onto the insides of the upper and lower molds.

30. The method of manufacturing the semiconductor device according to claim 7, wherein when said powder resin is sprayed, different kinds of resins are supplied onto the insides of the upper and lower molds.

31. The method of manufacturing the semiconductor device according to claim 8, wherein when said powder resin is sprayed, different kinds of resins are supplied onto the insides of the upper and lower molds.

32. The method of claim 1, wherein the first step is completed prior to beginning the third step.

* * * * *

UNITED STATES PATENT AND TRADEMARK OFFICE
CERTIFICATE OF CORRECTION

PATENT NO. : 5,733,802
DATED : March 31, 1998
INVENTOR(S) : Yumi Inoue et al.

It is certified that error appears in the above-indentified patent and that said Letters Patent is hereby corrected as shown below:

Claim 1, Col. 9, line 43, before "temperature", delete "[predetermined]".

Claim 24, Col. 11, line 10, "mold" should read --molds--.

Signed and Sealed this

Twenty-second Day of June, 1999

Q. TODD DICKINSON

Attest:

Attesting Officer

Acting Commissioner of Patents and Trademarks